United States Patent [19]

Moriyasu

[11] Patent Number: 5,034,698
[45] Date of Patent: Jul. 23, 1991

[54] DUAL-PATH WIDEBAND AND PRECISION DATA ACQUISITION SYSTEM

[76] Inventor: Hiro Moriyasu, 1314 S.W. 57th Ave., Portland, Oreg. 97221

[21] Appl. No.: 468,095

[22] Filed: Jan. 22, 1990

[51] Int. Cl.⁵ .............................................. H03F 3/68
[52] U.S. Cl. .................................. 330/84; 324/123 C; 330/51; 330/126; 330/148
[58] Field of Search .................... 330/2, 51, 84, 9, 126, 330/148; 324/123 R, 123 C, 124

[56] References Cited

U.S. PATENT DOCUMENTS 3,603,891 9/1971 Simeau ........................................ 330/9
4,517,523 5/1985 Miles ................................. 330/84 X

FOREIGN PATENT DOCUMENTS 675268 7/1952 United Kingdom ................... 330/9

Primary Examiner—James B. Mullins
Attorney, Agent, or Firm—Dellett, Smith-Hill and Bedell

[57] ABSTRACT

A dual path amplifier circuit configuration to obtain wideband and precision DC response includes a wideband voltage amplifier, an input termination, a virtual ground feedback amplifier, and a compensated attenuator. The circuit allows precision DC and wideband measurements through a common signal probe while maintaining the input impedance of the measurement instrument. An additional feature of the circuit is to selectively allow DC measurements before or after an attenuator. The circuit can provide combined wideband and DC signal output or separate wideband and DC outputs. Additionally, the circuit can use a DC offset to null the DC level of an input signal.

11 Claims, 11 Drawing Sheets

DUAL-PATH WIDEBAND AND PRECISION DATA ACQUISITION SYSTEM

BACKGROUND OF THE INVENTION

This invention relates to an electronic measurement system including both wideband AC and DC measurement devices and particularly to a circuit for such a system which maintains both AC and DC measurement accuracy while both measurement devices are simultaneously connected to a single input.

In electronic test and measurement applications, it is often necessary to measure wideband AC characteristics and DC characteristics of a given electrical signal. Even though it is highly desirable to make both wideband AC and DC measurements through a common probe, input, and attenuator system, because of interference between the two types of measurement devices, this has resulted in undesirable compromises.

Wideband instruments, such as oscilloscopes, have excellent AC and transient waveform measurement capability because the input circuit has carefully controlled resistance and capacitance loading. Any additional loading, whether resistive or reactive, will cause an impedance mismatch and undesirable waveform distortion. For this reason, precision DC measuring devices, such as digital multimeter devices, are not connected to the input circuit of wideband oscilloscopes. Existing methods for combined oscilloscope and digital multimeter testing require separate inputs, thus requiring separate test probes. Other methods attempt to monitor DC voltage after the input stage of the oscilloscope to maintain wideband and transient response but at the sacrifice of DC measurement accuracy.

Alternatively, an oscilloscope may be used to measure DC voltage to a limited accuracy by grounding the input through an AC-DC-ground switch to establish the DC reference level. This is used to null drift of the input amplifier when measuring the incoming DC signal.

These methods are cumbersome, yet commonly used.

SUMMARY OF THE INVENTION

According to the present invention, an electronic test and measurement system is provided with a signal input attenuator having dual paths to maintain both wideband signal fidelity and DC accuracy. A dual path amplifier circuit configuration provides wideband signal response while providing a precise DC output response by utilizing a wideband voltage amplifier as a main signal path, a termination means returned to a virtual ground, and an amplifier with output fed back to the input to provide the precision DC voltage response at the output.

An objective of this invention is to provide a precision DC measurement and wideband waveform measurement utilizing a common signal attenuator while preserving the wideband characteristics of attenuators as used in measurement systems such as oscilloscopes or automated test equipment systems.

Yet another objective of this invention is to provide a separate DC measurement path which is immune to the DC amplifier drift of a wideband input circuit.

Yet another objective of this invention is to preserve the strict constant input impedance, both resistance and capacitance, at the instrument input terminal.

A further objective of this invention is to provide precision DC and wideband AC measurement through a common signal probe without sacrificing either DC or AC measurement characteristics.

Yet another objective of this invention is to provide a more complete and compensated input configuration including probe, attenuator, calibrated DC offset, and wideband amplifier with a precision DC output which has a closed loop feedback means referred back to the original incoming signal.

Yet another objective of this invention is to provide a calibrated, stable offset voltage means while preserving wideband and precision operation.

Yet another objective of this invention is to provide a wideband and precision DC response at a combined output of the amplifier output.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION

Figure 1:
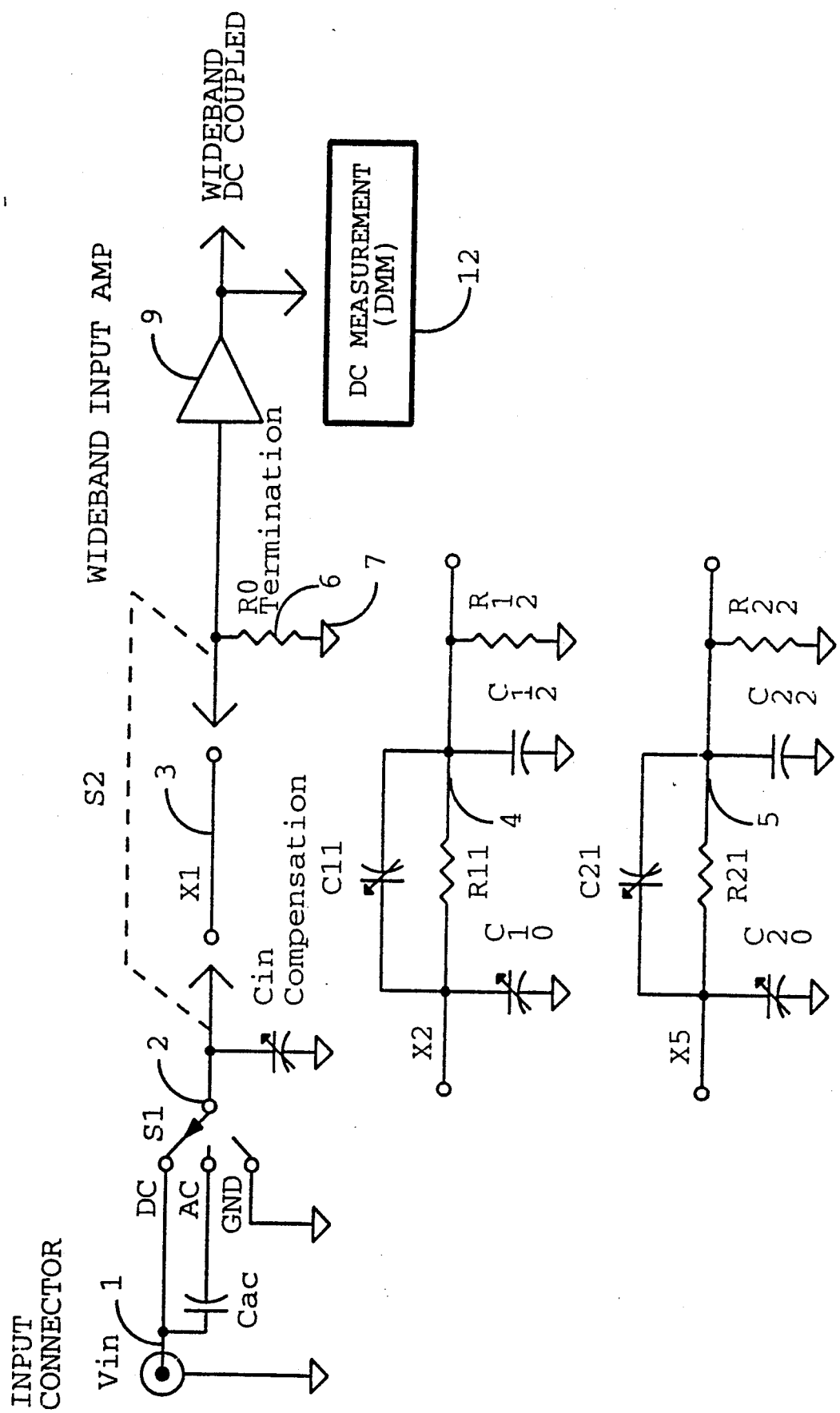
FIG. 1 is a block diagram of a conventional compensated input attenuator and input amplifier system according to the prior art.

A conventional wideband input attenuator system is shown in FIG. 1 where the signal applied to the input connector passes through the signal coupling switch, S1, and then the step attenuator, S2, which provides attenuation in fixed amounts, e.g. x1, x2, x5, x10, x20, etc. The signal through the attenuator is terminated by a resistor 6 to signal ground at 7 with resistance equal to the input characteristic resistance, typically 1 megohm. The signal then passes into the wideband input amplifier 9.

Constant impedance at the input is maintained by proper selection of attenuator resistors and capacitors.

For example, on the x2 position, illustrated at 4, the input resistance is determined by (R11+(R12 shunted by R0)). Other attenuation ranges maintain the same constant input impedance.

Figure 2:
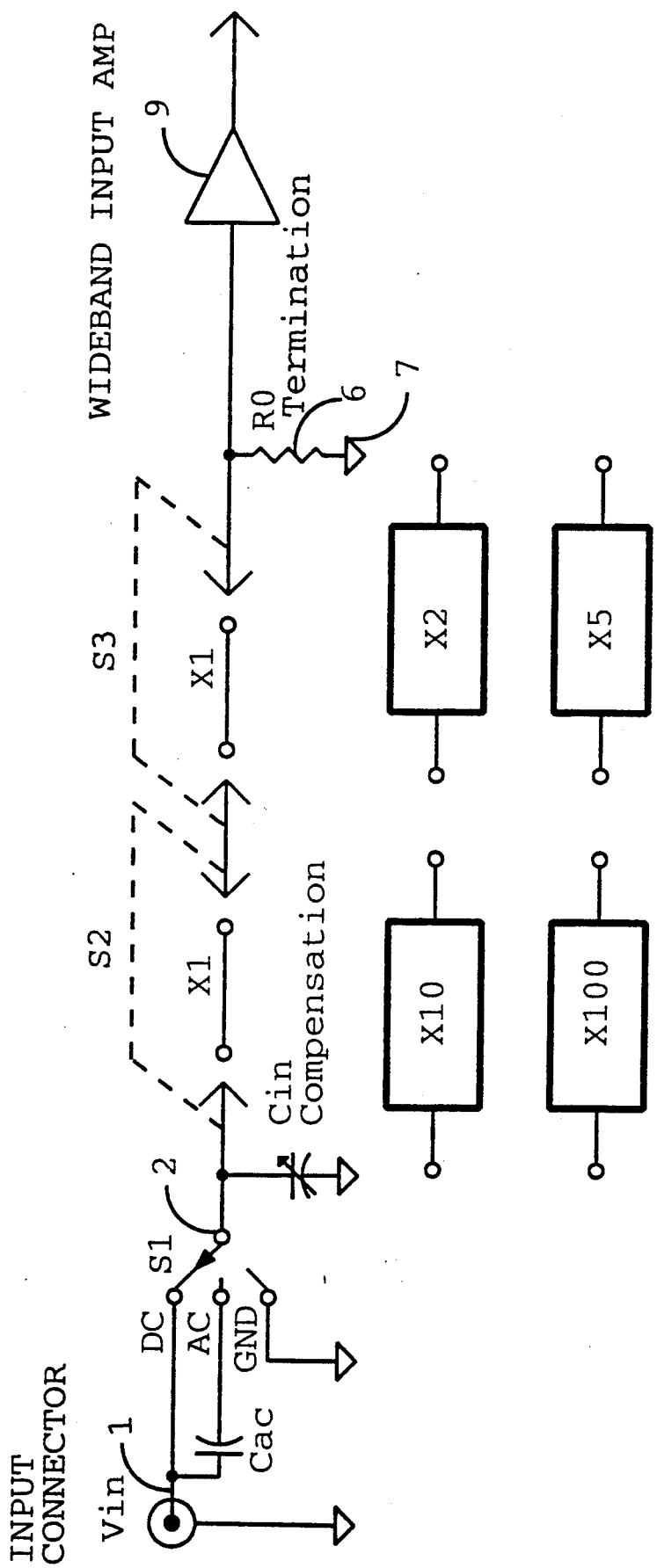
FIG. 2 is a detailed block diagram of a compensated input attenuator in a stacked attenuator configuration and an input amplifier according to the prior art.

FIG. 2 shows a conventional stacked attenuator where separate decade and x1, x2, x5 sequence attenuators are terminated to signal ground through a resistor with resistance equal to the input characteristic resistance.

Now referring back to FIG. 1, since the input circuit requires carefully matched RC time constants to preserve transient response characteristics, attaching a conventional DC measurement device 12 at any point on the input circuit before the input amplifier can adversely affect the transient response by capacitively loading, resistively loading or, in some cases, by injecting a signal such as from a dual slope measurement device. Accordingly, the DC measurement device 12 is sometimes attached after the input amplifier stage of the wideband measurement device.

While the latter scheme isolates the wideband measurement device from the loading effects of the DC measurement device, the accuracy of the DC measurement device is limited by the DC drift characteristics of the wideband input amplifier 9. Because of this, test and measurement equipment which includes both wideband and DC measurement devices usually requires separate inputs and thus separate test probes.

Figure 3:
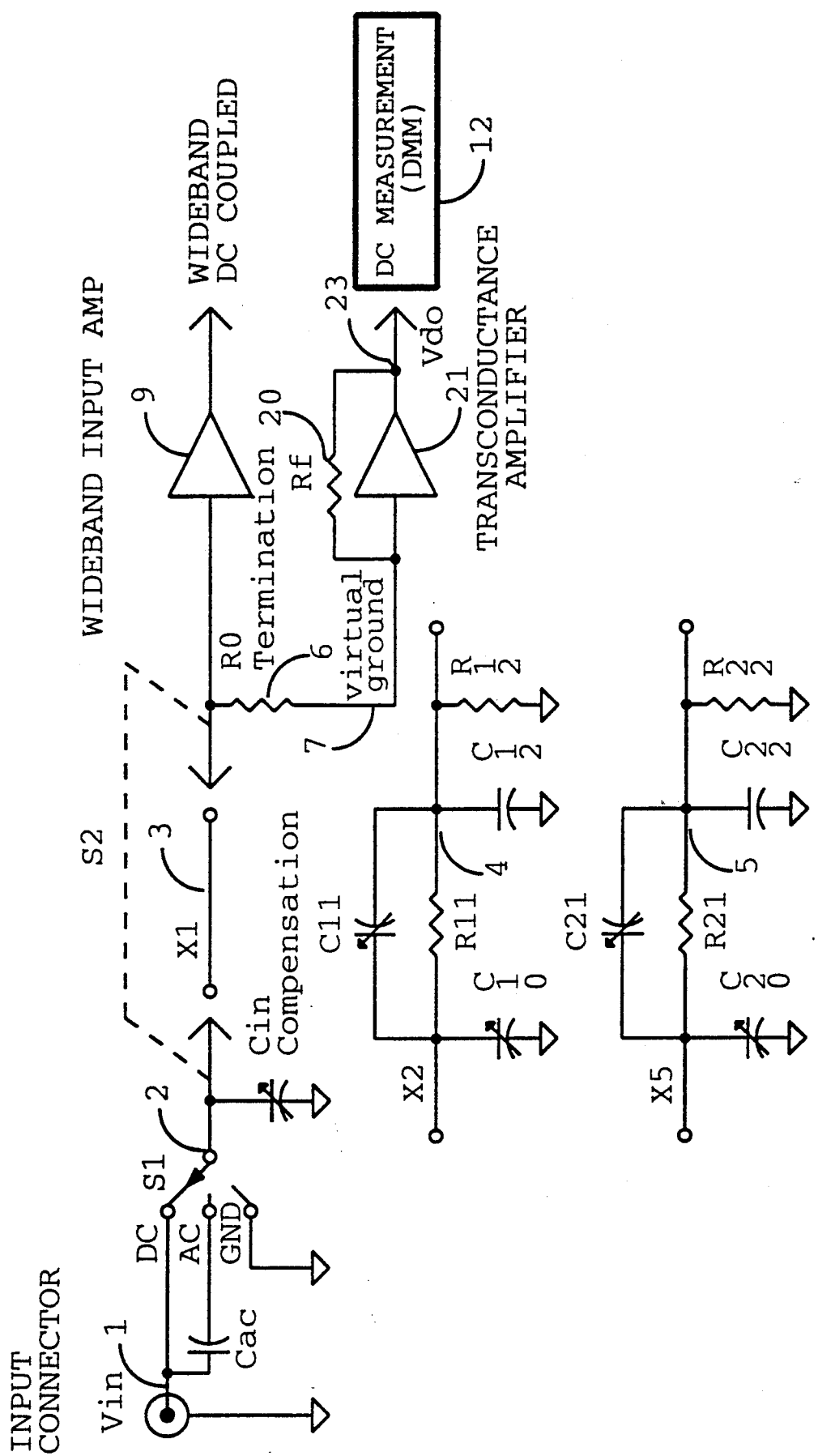
FIG. 3 is a detailed block diagram of the present invention.

FIG. 3 illustrates a block diagram of the dual-path wideband and precision DC measurement system utilizing a common attenuator according to the present invention. The system is comprised of six component portions: AC/DC/ground selection 2, switched compensated attenuators 3, 4 and 5, termination resistor R0, 6, wideband signal channel 9, transconductance amplifier 21, and DC measurement device 12. The input selector, step attenuators, and wideband amplifier contain conventional and well understood circuitry for maintaining constant input resistance and capacitance at any combination of switches.

A key concept of the present invention is utilization of the termination resistance R0 for two purposes. First, resistor R0, 6, is used as termination of the input with a fixed resistance and, second, as a current sensing resistor to read the voltage at the output of the input attenuator. In a conventional attenuator system, the termination resistor, R0, is as shown in FIG. 1 and FIG. 2. The present invention replaces the ground at the remote end of the termination resistor with a virtual ground at the input of current to voltage transconductance amplifier 21.

The purpose of the transconductance amplifier 21 is: (a) to maintain the termination resistor, R0, at a virtual ground such that the wideband signal will see a constant resistance, typically 1 megohm; (b) to convert the current through the termination resistor into a precise reproduction of the input voltage at the transconductance amplifier output, and; (c) to provide a low output impedance signal which may be sent to a conventional DC measuring device such as a digital multimeter or any other similar device such as an AC voltmeter or RMS meter, without loading, injecting electrical noise or otherwise affecting the signal to the wideband measurement system, or being influenced by amplifier drift of a conventional wideband amplifier.

The embodiment shown in FIG. 3 allows use of AC coupled mode through use of the DC/AC coupling switch 2 and conventional precision AC measuring devices to precisely measure AC parameters such as RMS voltage. Furthermore, since constant input resistance and capacitance are maintained at the input terminal, a single probe can be used for high impedance DC, AC, and wideband transient signal measurement, thus eliminating the requirement of separate probes.

In critical high frequency circuits, such as oscillator circuits, conventional precision DC or low frequency AC measurement devices cannot be directly connected due to the unknown and highly capacitive loading effects of such measurement devices. Use of a common high frequency, low capacitance input circuit, provides truer DC voltage measurement of certain circuits which are sensitive to capacitive loading.

Figure 4:
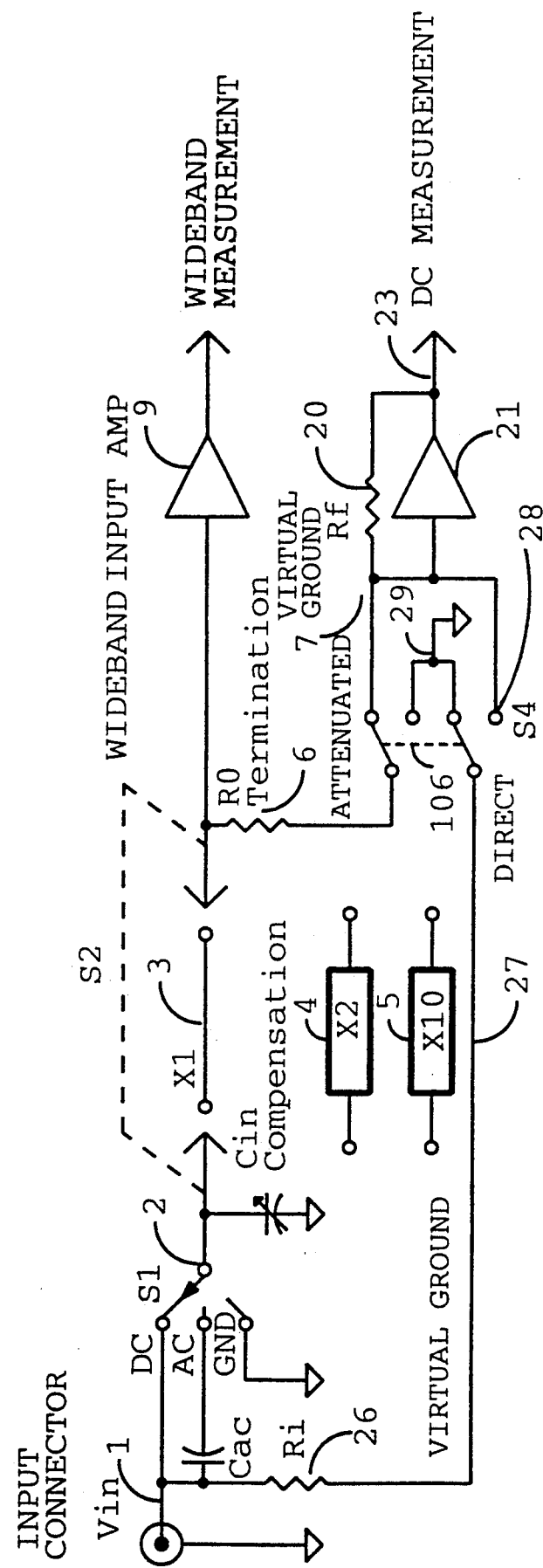
FIG. 4 is a block diagram of the present invention having both direct and attenuated paths to the separate DC current to voltage amplifier.

FIG. 4 illustrates an embodiment of the present invention which allows precise DC measurements before the compensated step attenuator, or after the attenuator while maintaining the constant input impedance characteristics. This circuit allows DC measurement while its wideband measurement system is AC coupled. Referring to FIG. 4, the input signal applied at 1 is split between input termination resistor, Ri, 26, and the stack attenuators which are 10 megohm and 1.111 megohm, respectively, for this embodiment. The output of the stack attenuator is terminated with 1.111 megohm in this embodiment. The combination of the input resistor and the step attenuator resistance in parallel forms a constant input resistance and capacitance for any setting of the step attenuator, thus allowing the use of a common signal probe for both DC and wideband transient signal analysis. Since the input termination resistor 26 and the output termination resistor are returned to virtual ground 28 and actual signal ground 29 respectively, the wideband characteristics through the input attenuators 3, 4 and 5, and amplifier 9 are maintained as in a conventional wideband compensated voltage attenuator.

Precision DC measurement at the input terminal is performed by monitoring the DC current through the input terminating resistor 26 by switching switch S4, 106, to connect lead 27 to node 28, where node 28 is a current summing virtual ground of transconductance amplifier 21. The feedback through feedback resistor 20 maintains node 28 at virtual ground and the transconductance amplifier produces an output voltage, Vdo, proportional to the negative of the input voltage, Vin. The voltage at Vdo, at node 23, is determined by the ratio of Rf/Ri.

Still referring to FIG. 4, if switch S4, 106, is switched to the attenuator mode, DC measurements will be made using the conventional step attenuator in a manner similar to that described for FIG. 3. In this case, the output at Vdo is (Vin / attenuation factor) * (Rf/R0). By setting Rf to the proper value, precision DC measurement is accomplished at node 23.

Figure 5:
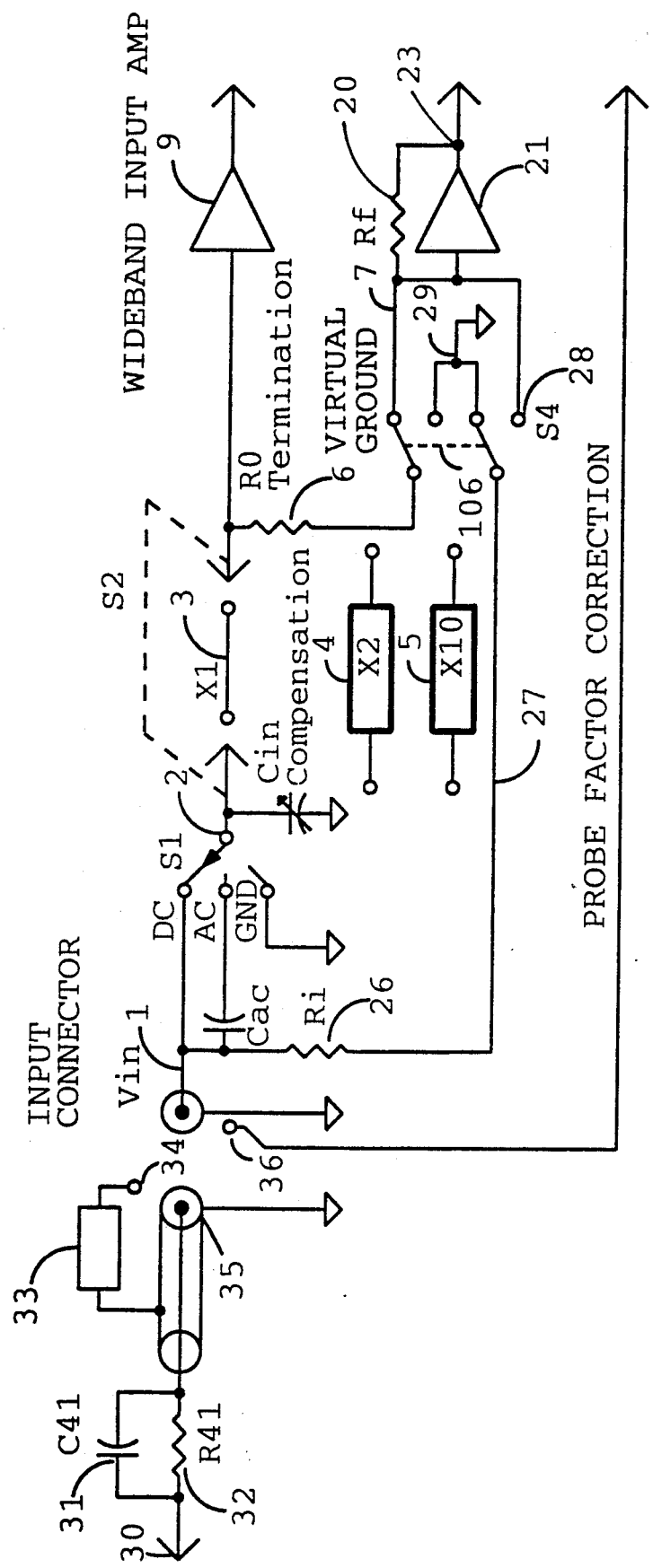
FIG. 5 illustrates the present invention including use of a common probe for both wideband signal measurement and precision DC measurement.

FIG. 5 illustrates in detail the operation of a common probe with the dual-path wideband and precision attenuation system. The circuit consists of three main components: (a) an attenuating probe; (b) the dual-path input system as described in conjunction with FIG. 3 and FIG. 4; and (c) a probe sensing device. A conventional attenuating signal probe, comprising resistor R41, 32, typically having a value of 9 megohms for a x10 attenuating probe, and parallel capacitor C41, 31, a compensating capacitor, is connected via cable to connector 35. This probe, with input impedance Rin and Cin, when connected to equipment connector 36 will form a voltage divider. Since proper RC compensation is maintained by the probe and the measurement system, the measurement system input circuit attenuation and probe signal attenuation is performed by conventional voltage divider action. In the typical case of a x10 attenuating probe, the voltage at node 1 will be one tenth of the voltage at probe tip 30.

Several conventional methods can be utilized to provide the proper scale factor for the dual-path wideband and precision DC measurement device. Conventional means include: (a) an additional electrical contact 34 attached to or as a part of the connector 35 through which, when the probe is attached to the system, the system can detect a probe impedance or voltage coding 33 unique for each probe attenuation factor; (b) a mechanical means to detect a mechanically coded collar on the skirt of the probe connector 35 which in turn is detected at point 36 and then, in turn, is converted to an electrical signal to adjust for scale factor change; and (c) a manual switch to simply code the presence of an attenuating probe when such probe is attached.

Still referring to FIG. 5, the system will allow precision signal processing of AC and DC signals independently. That is, the wideband signal can include only the AC component, while both wideband and DC measurement devices share a common probe. This is accomplished by operating switch S1, 2, to the AC mode and switch S4, 106, to a direct mode. In this mode of operation, the AC component of an input signal will pass through the AC coupling capacitor and attenuator to the wideband amplifier in the conventional manner. Hence, the wideband system will measure only the AC component of the input signal. The DC signal, on the other hand, will be passed through input termination resistor 26 to the transconductance amplifier 21. Hence, the DC measurement device has access to the DC component of the input signal. Referring still to FIG. 5, in another mode of operation, with switch S4, 106, in the attenuated mode, the circuit performs as described in connection with FIG. 3 and FIG. 4.

Figure 6:
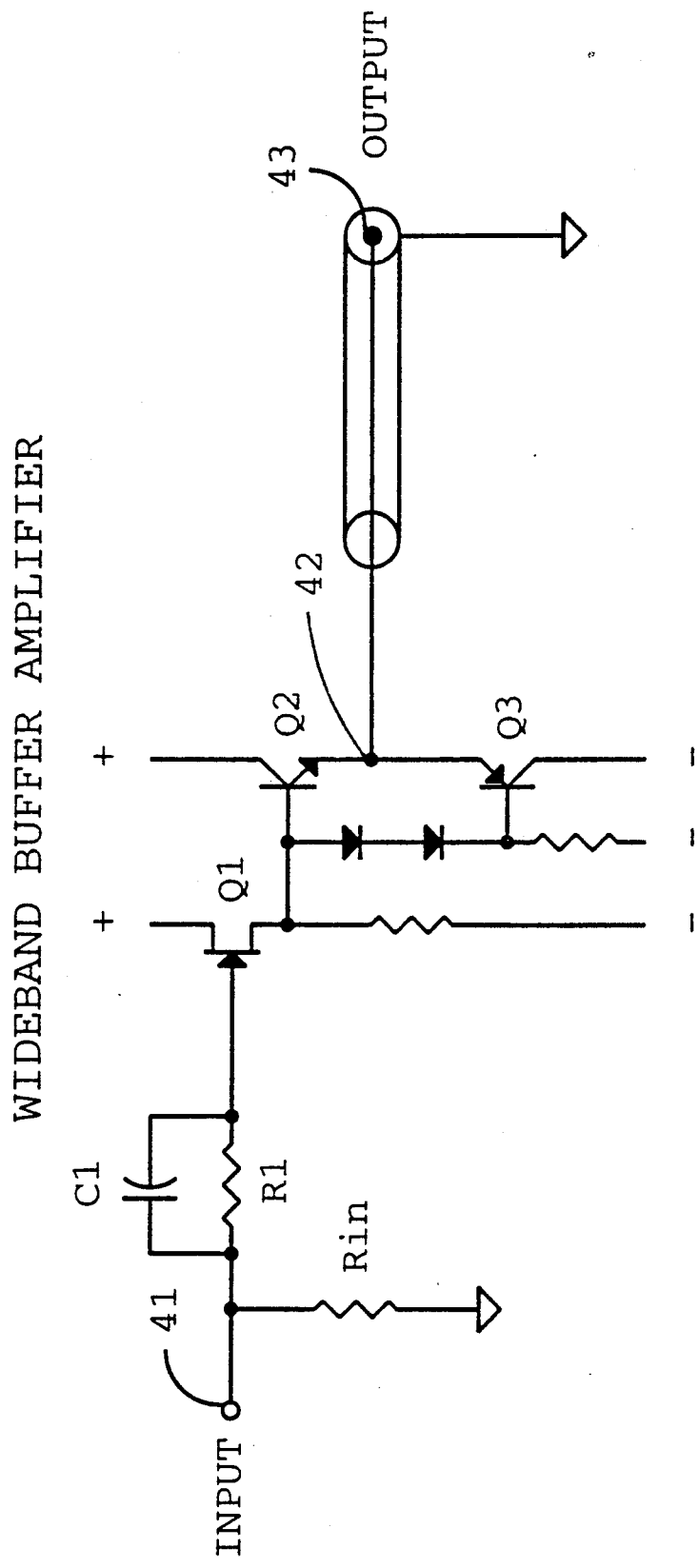
FIG. 6 shows a conventional active FET probe with wideband low input capacitance characteristics.
Figure 7:
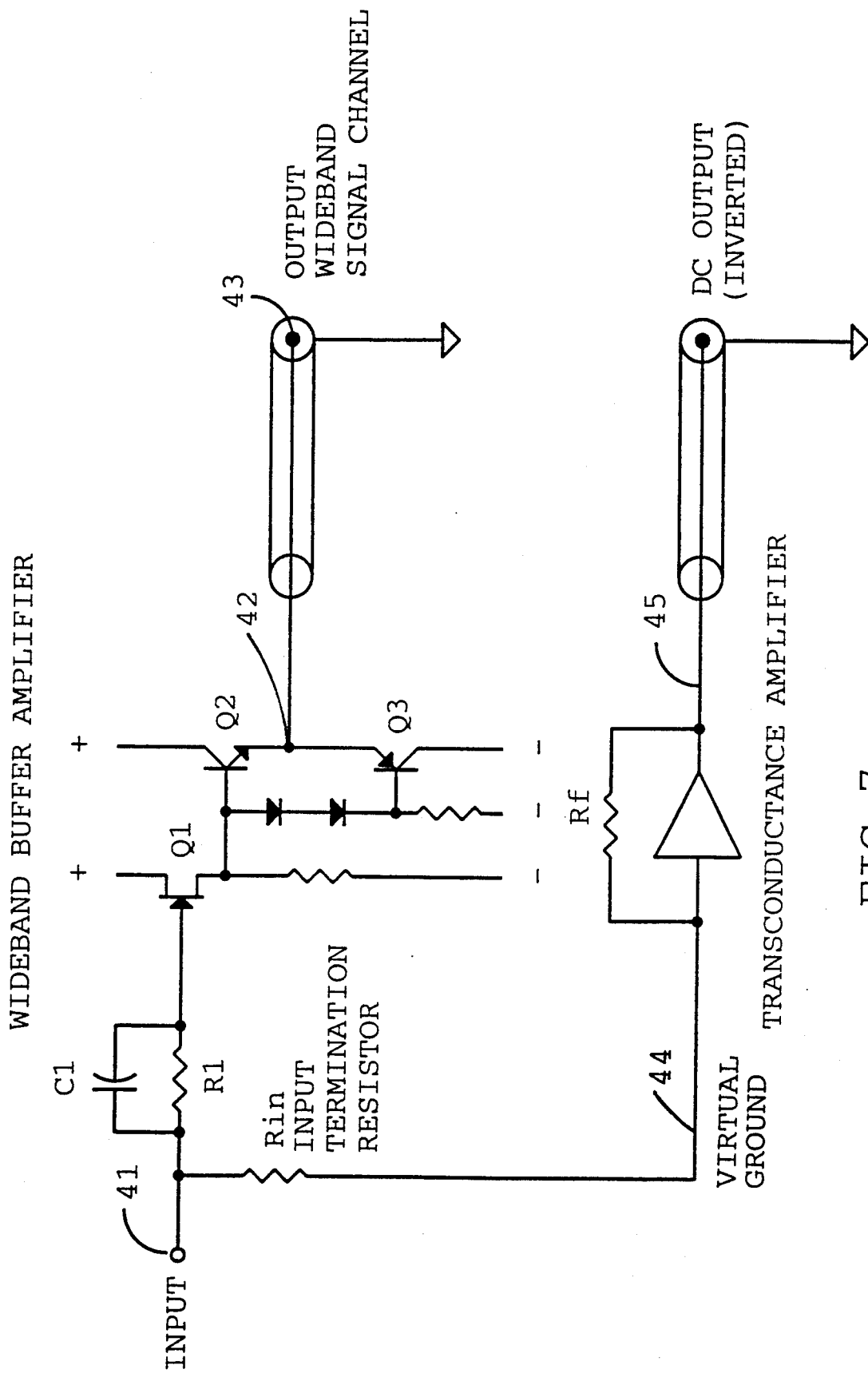
FIG. 7 illustrates an embodiment of the present invention as a dual path wideband and precision DC active probe system.

FIGS. 6 and 7 illustrate, respectively, a conventional wideband active probe and a new dual path wideband and precision DC active probe system according to the present invention. An active probe is used primarily for its low capacitance, high impedance input which is achieved through a Field Effect Transistor (FET) input circuit. The conventional circuit, as in FIG. 6, requires the designer to trade off DC stability for high frequency response.

Referring to FIG. 7, the wideband precision active probe system contains dual paths to achieve additional DC gain accuracy without sacrificing high frequency response. The signal at node 41 will provide the signal directly to the conventional FET buffer amplifier and the DC coupled signal will appear at node 42 and node 43 as in the conventional active probe. The input signal at node 41, which in the conventional active probe is typically terminated with 1 megohm or 10 megohm to signal ground, is now terminated to the virtual ground 44 of the transconductance amplifier. Thus the input resistance is still determined by Rin and the input capacitance is still determined by the aggregate of stray capacitance and the effective capacitance of the FET. Precision DC measurement is achieved by the transconductance amplifier as shown in FIG. 7 where the output voltage is −Rf/Rin. Thus the input signal is reproduced (inverted) at the DC output 45. This allows precision DC and low frequency AC measurement without adding any additional load to the test circuit, which would compromise wideband performance.

Figure 8:
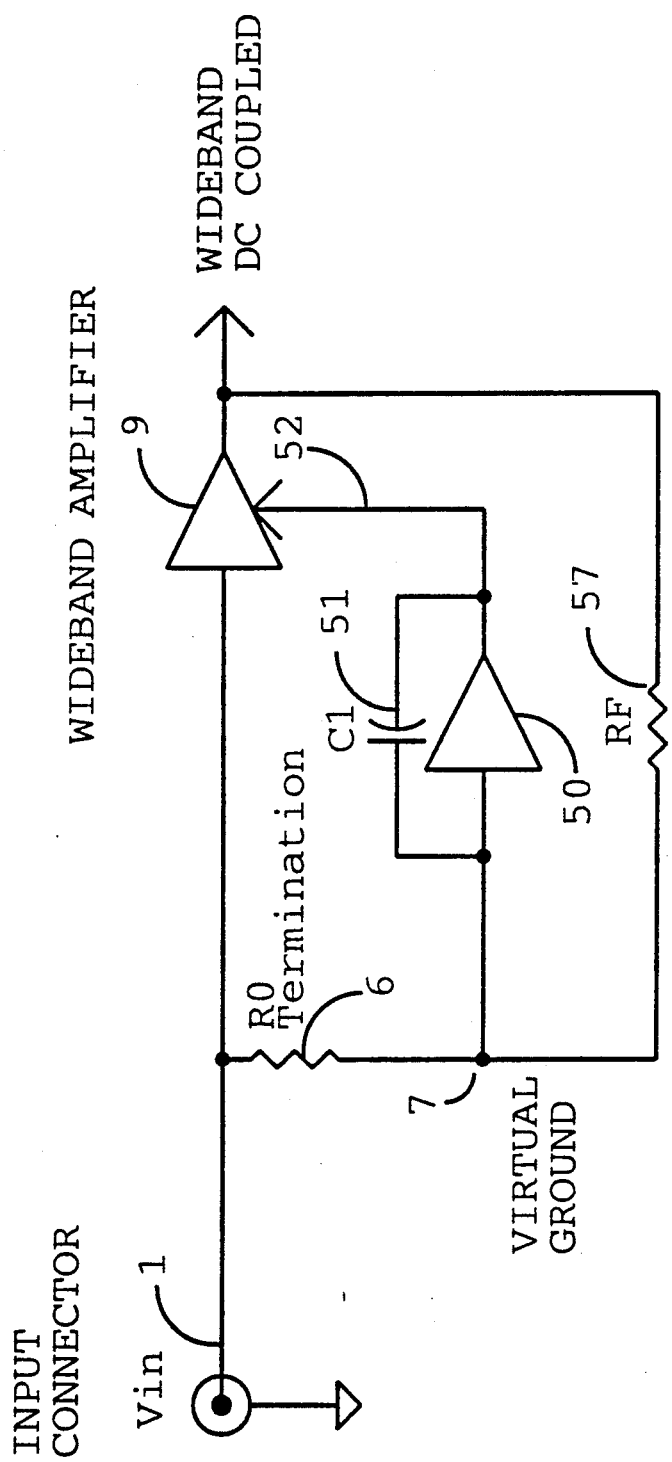
FIG. 8 is a dual path amplifier with a combined output wideband voltage configuration.

FIG. 8 illustrates a dual path amplifier with a combined output wideband voltage amplifier circuit configuration having a dual path main voltage amplifier and a virtual ground feedback amplifier to stabilize the DC performance at the combined output point of the amplifier.

Voltage amplifier 9, having a voltage gain, G, and high input impedance, determines the basic gain characteristics of the overall amplifier system. The output of the voltage amplifier may have single ended or differential output. In this illustration, negative polarity S of the output is used. A second signal path consists of input termination resistor 6, one terminal being attached to the voltage amplifier input and the other end of the termination resistor being connected to the virtual ground input 7 of the negative feedback amplifier 50. The DC negative feedback path is provided by the feedback resistor, Rf, 57, which senses the DC level of the output of the main amplifier 9. Virtual ground feedback amplifier 50, having high DC gain and stable DC integration characteristics through local feedback capacitor 51 from its own output to the virtual ground, maintains virtual ground at the input.

The output of the feedback amplifier provides a DC bias adjustment 52 to the main amplifier 9. The DC bias control voltage or current can be provided at the input of the voltage amplifier or DC bias adjustment circuit within the wideband amplifier. A key concept of the present invention is dual path voltage sensing of input voltage, having a main path through wideband amplifier 9 which determines the wideband signal gain characteristics and a second path for DC sensing through the input termination resistor returned to the virtual ground 7 of a feedback amplifier 50 which compares DC output and input and maintains virtual ground, thus resulting in wideband response and precision DC response at the output.

DC voltage sensing using the virtual ground side of input termination resistors has an advantage; it provides a constant input impedance to the wideband voltage amplifier. Thus, the DC path does not affect the wideband signal characteristics of the wideband amplifier.

Further advantages of the present invention can be illustrated with examples showing how the invention allows implementation in conjunction with compensated voltage attenuators, high impedance probes and active buffer amplifiers.

The advantages of the present invention are evident in that it allows precision DC measurement through a wideband amplifier including required input signal conditioning and at the same time DC output precision is maintained with the closed loop amplifier.

Figure 9:
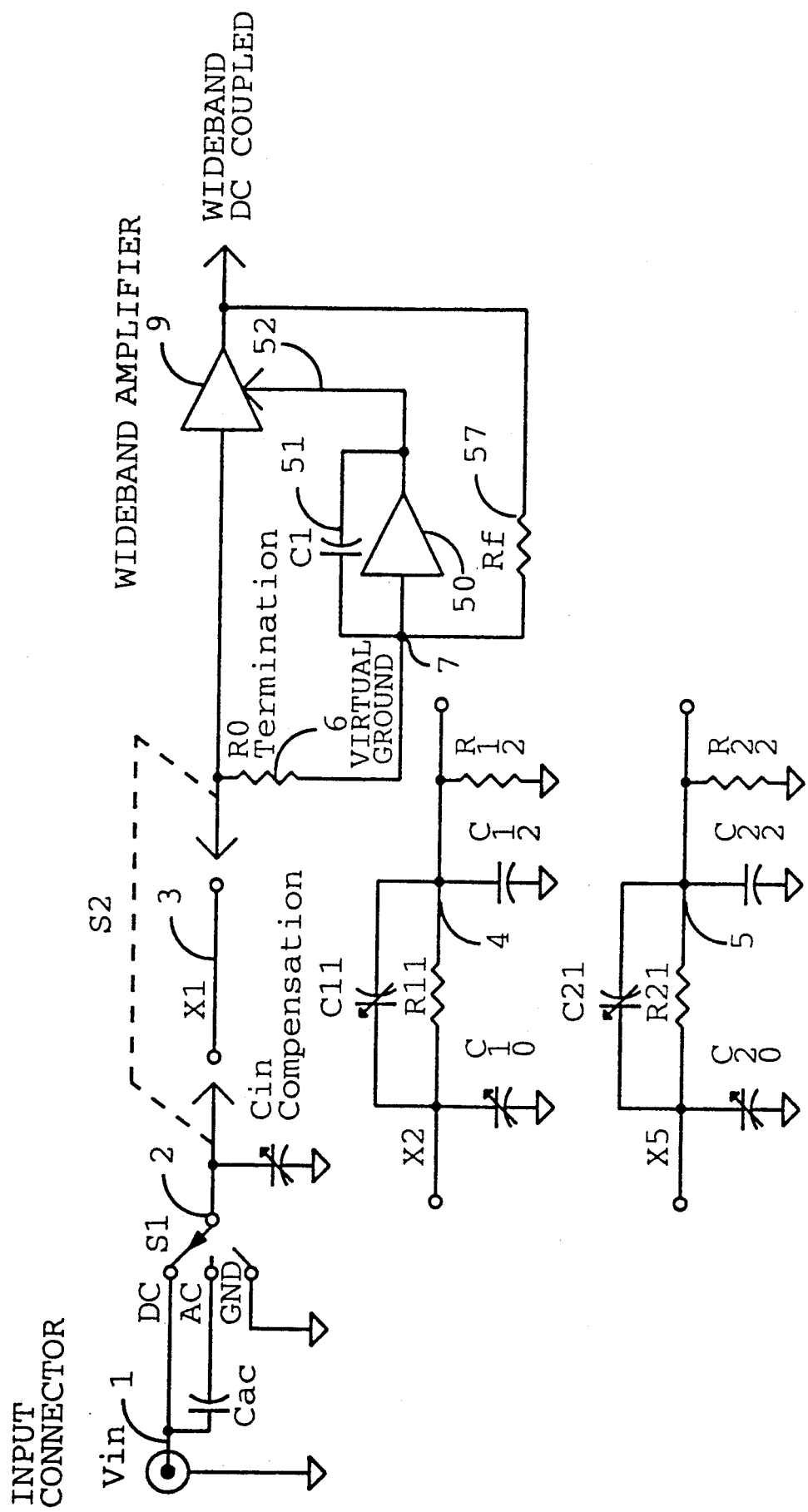
FIG. 9 is a wideband voltage amplifier with dual path DC compensation with combined output amplifier working with a compensated voltage attenuator.

FIG. 9 illustrates the wideband voltage amplifier with dual path DC compensation with a combined output amplifier working with a compensated voltage attenuator. In this mode of operation, termination resistor 6 provides a constant termination impedance for the voltage attenuator. Since the ground side of the termination resistor is returned to the virtual ground 7, attenuator selection and wideband attenuation of input signal will be monitored by the wideband amplifier 9, and compensation and signal response will be unaffected by the feedback loop characteristics provided forward gain G of voltage amplifier and second DC path gain Rf/R0 are equal.

Figure 10:
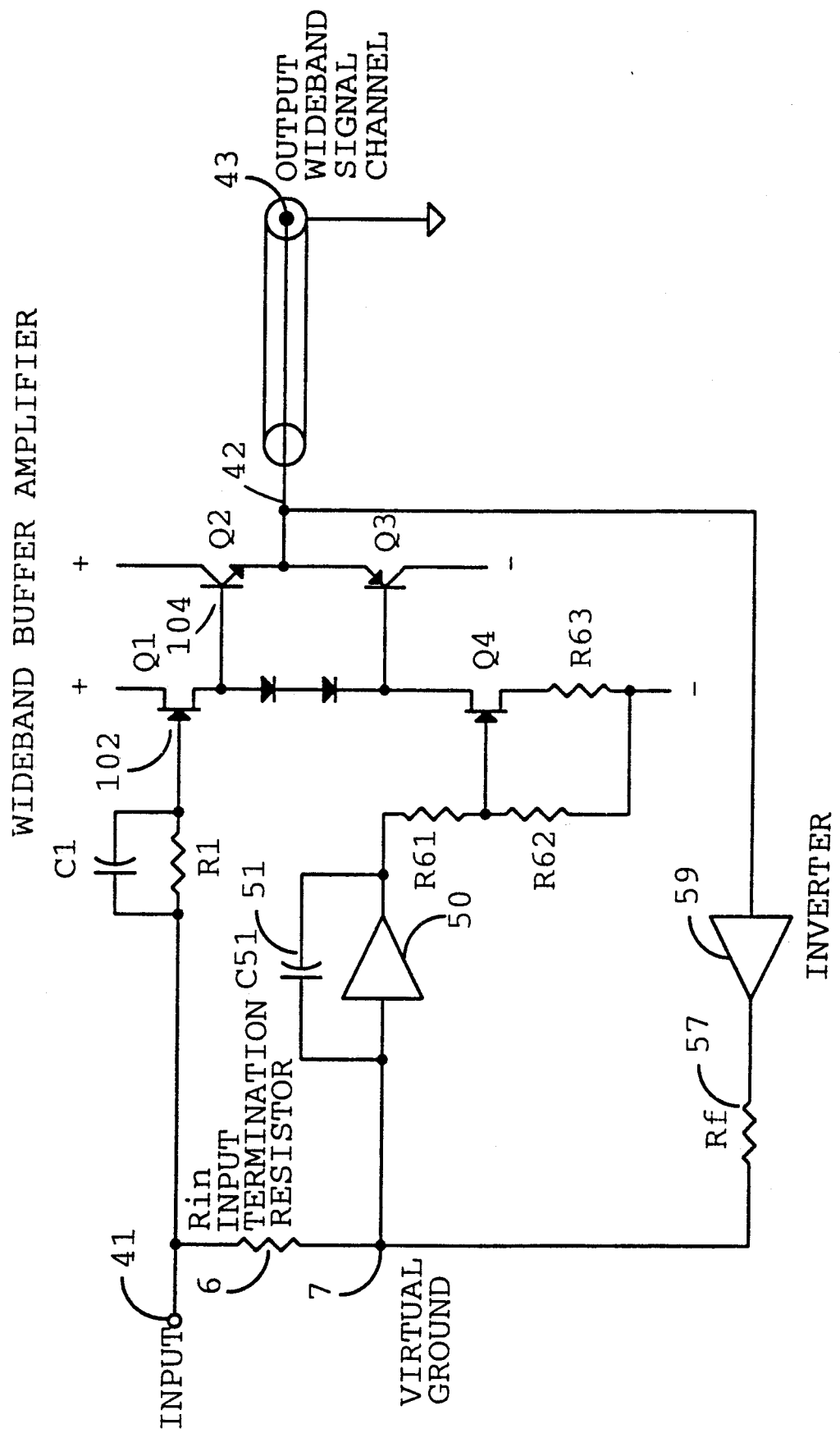
FIG. 10 illustrates the dual path amplifier scheme used for a wideband buffer amplifier or active high impedance voltage probe amplifier.

FIG. 10 illustrates another embodiment of the present invention, and the dual path amplifier scheme used as a wideband buffer amplifier or active high impedance voltage probe amplifier. Referring to FIG. 10, wideband main signal path is provided by FET follower transistor 102 and emitter follower transistor 104. Input termination resistor 6 is connected at the input, and the ground side of the termination resistor 6 is connected to the virtual ground 7 to provide stable input termination.

Virtual ground feedback amplifier, 50, provides a DC bias adjustment to the buffer amplifier. In this configuration, a feedback path is provided via a feedback polarity inversion amplifier 59 and feedback resistor 57.

The virtual ground 7 characteristics are maintained by a local feedback capacitor 51 to stabilize the feedback loop and output feedback loop through inverting amplifier 59 and resistor 57. For a unity gain buffer amplifier, the ratio of Rf and Rin is unity to retain DC response equal to that of the unity gain buffer amplifier.

Figure 11:
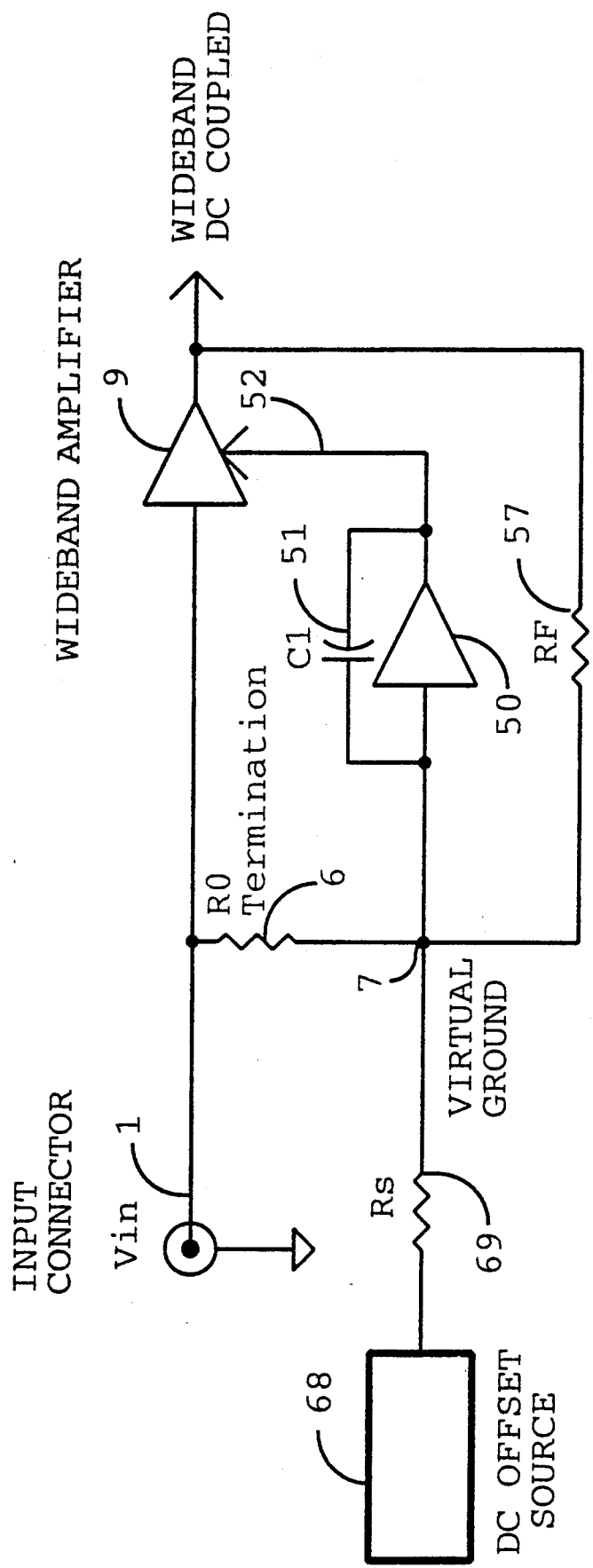
FIG. 11 illustrates a method of generating a calibrated DC offset voltage using the dual path amplifier scheme.

FIG. 11 illustrates a method of generating a calibrated DC offset voltage. The DC offset source 68 is connected to the virtual ground point 7 of the feedback amplifier through series resistor 69. The current through resistor 69 will offset input DC current through termination resistor 6 to null the DC level of the incoming signal; thus the output signal represents the input signal offset by the calibrated offset. This DC offset may be generated by any voltage source or current source including a digital to analog converter.

While several embodiments of the present invention have been shown and described, it will be apparent to those skilled in the art that many other changes and modifications may be made without departing from the invention in its broader aspects. The appended claims are therefore intended to cover all such changes and modifications as fall within the true spirit and scope of the invention.

I claim:

1. A wideband dual path amplifier for obtaining wideband voltage amplification output and separate precision DC output comprising:
   a first amplification means having high input impedance, and having gain which determines the wideband characteristics of the overall amplifier system, said first amplification means providing wideband voltage amplification output;
   a second amplification means having negative feedback for producing a virtual ground and a precision DC output, said virtual ground being produced at an input of said second amplification means, said negative feedback controlling DC output of said second amplification means, said DC output being separate from said wideband voltage amplification output; and
   a first input termination means having a terminal coupled to an input signal terminal and a terminal coupled to said virtual ground.

2. A wideband dual path amplifier for obtaining wideband voltage amplification output and separate precision DC output comprising:
   a first amplification means having high input impedance, and having gain which determines the wideband characteristics of the overall amplifier system;
   a second amplification means having negative feedback for producing a virtual ground and a DC output, said virtual ground being produced at an input of said second amplification means, said negative feedback controlling DC output of said second amplification means; and
   a first input termination means having a terminal coupled to an input signal terminal and a terminal coupled to said virtual ground, with a compensated voltage attenuator placed in series between the input signal terminal and said first amplification means wherein said first input termination means is connected to the input side of said attenuator to monitor precision DC voltage at the input independent of the setting of said voltage attenuator.

3. A wideband dual path voltage amplifier according to claim 2 further comprising selection means to select AC/DC coupling for said first amplification means, said first input termination means being connected to an input of said AC/DC coupling means for sensing DC voltage independent of AC/DC coupling and voltage attenuator setting.

4. A wideband dual path voltage amplifier according to claim 2 further comprising:
   a second input termination means, said second input termination means being connected to the output of said voltage attenuator; and
   switching means, said switching means being connected to said virtual ground and a physical ground and being selectively operable to connect said first input termination means to said virtual ground and said second input termination to physical ground, and alternatively to connect said first input termination means to physical ground and said second input termination means to said virtual ground for monitoring precision DC voltage before or after said attenuator while maintaining precise wideband signal compensation characteristics of said attenuator and said wideband amplification means.

5. An amplification system comprising:
   a first amplification means;
   a compensated attenuator connected between an input signal terminal and said first amplification means;
   a first voltage sensing means;
   a second voltage sensing means;
   a second amplification means to provide a virtual ground and to convert current through said first and second voltage sensing means to a corresponding precise voltage at the output of said second amplification means; and
   a switching means operable to alternatively connect said first voltage sensing means or said second voltage sensing means to said virtual ground or physical ground.

6. The system according to claim 5 wherein said first voltage sensing means comprises an impedance which senses voltage at a point between the input signal terminal and said attenuator, and wherein said second voltage sensing means comprises an impedance which senses voltage at a point between said attenuator and said first amplification means.

7. A system for controlling the DC bias of a wideband amplifier comprising:
   wideband signal amplification means having high input impedance, and having gain which determines the wideband characteristics of the overall amplification system;
   negative feedback means;
   inverter means, said inverter means providing said negative feedback means with an inverted representation of the output of said wideband signal amplification means;

virtual ground input feedback amplification means providing high gain negative feedback through said negative feedback means to provide a bias adjustment to said wideband signal amplification means; and input termination means, said input termination means being connected between the input of said wideband signal amplification means and said virtual ground.

8. A system according to claim 7 in which said input termination means is a part of a voltage attenuator network to provide wideband signal acquisition.

9. A wideband signal acquisition and precise DC measurement system comprising:

compensated attenuation means to attenuate an incoming signal while maintaining wideband frequency response and constant input resistance and capacitance;

termination means connected to said attenuation means for allowing a voltage measurement at one end of said termination means and allowing current measurement at the other end of said termination means;

amplification means having high input impedance to monitor the output of said compensated attenuation means to provide a wideband signal for further signal conditioning and measuring; and transconductance amplification means providing a virtual ground at the input thereof by means of a feedback resistor coupled from the output of said transconductance amplification means to the input thereof, said attenuation means being coupled to said virtual ground through said termination means for monitoring current through said termination means, said current precisely representing voltage at the output of said attenuation means and said transconductance means producing a precise DC voltage representation of an incoming signal.

10. A signal acquisition system having dual path wideband and precision DC measuring outputs comprising:

input coupling selection means to choose AC or DC coupling of the input signal and alternatively to turn off the input signal by means of grounding;

compensated voltage attenuation means to provide wideband compensated signal attenuation;

amplification means having high input impedance to monitor an output terminal of said compensated attenuation means, said amplification means providing a wideband signal for further signal conditioning and measuring;

input voltage sensing means which contributes a constant input impedance of resistance and capacitance when combined with said compensated attenuation means, said input voltage sensing means being connected to said input signal coupling selection means; and transconductance amplification means having a virtual ground at its input, said virtual ground being connected to said input voltage sensing means for providing a current which represents voltage of the incoming signal, and said transconductance amplification means producing a precise DC voltage representation of the incoming signal at the output of said transconductance amplification means.

11. A signal acquisition system having a dual path and separate wideband and precision DC measurement outputs comprising:

high input impedance amplification means to monitor wideband signals at its input and provide a low impedance output to additional signal conditioning, processing and measuring systems;

transconductance amplification means providing a virtual ground at its input, said amplification means having feedback means for DC output voltage scaling; and input termination means to establish the characteristic input impedance of the signal acquisition system, said input terminal means being connected between signal input and said virtual ground.

* * * * *

UNITED STATES PATENT AND TRADEMARK OFFICE
CERTIFICATE OF CORRECTION

PATENT NO. : 5,034,698
DATED : July 23, 1991
INVENTOR(S) : Hiro Moriyasu

It is certified that error appears in the above-identified patent and that said Letters Patent is hereby corrected as shown below:

Column 5, line 48, "offDC" should be --off DC--.

Column 10, line 42, "input terminal" should be --input termination--.

Signed and Sealed this

Twenty-third Day of February, 1993

Attest:

STEPHEN G. KUNIN

*Attesting Officer*    Acting Commissioner of Patents and Trademarks